US012582005B2

(12) United States Patent
　　　Han

(10) Patent No.: US 12,582,005 B2
(45) Date of Patent: Mar. 17, 2026

(54) INKJET PRINTING APPARATUS AND DISPLAY PANEL MANUFACTURING METHOD USING THE SAME

(71) Applicant: Samsung Display Co., Ltd., Yongin-si (KR)

(72) Inventor: Jeongwon Han, Seongnam-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 531 days.

(21) Appl. No.: 18/093,567

(22) Filed: Jan. 5, 2023

(65) Prior Publication Data

US 2023/0307431 A1　　Sep. 28, 2023

(30) Foreign Application Priority Data

Mar. 25, 2022　(KR) ........................ 10-2022-0037636

(51) Int. Cl.
　　*H01L 25/16*　　(2023.01)
　　*B41J 3/407*　　(2006.01)
　　*H01L 21/68*　　(2006.01)

(52) U.S. Cl.
　　CPC ............ *H01L 25/167* (2013.01); *B41J 3/407* (2013.01); *H01L 21/68* (2013.01)

(58) Field of Classification Search
　　CPC ........ H01L 25/167; H01L 21/68; B41J 3/407; B41J 2/01; B41J 11/001
　　See application file for complete search history.

(56) References Cited

U.S. PATENT DOCUMENTS

| | | | |
|---|---|---|---|
| 7,393,081 B2 * | 7/2008 | Maekawa | .............. B41J 2/2125 438/21 |
| 7,662,008 B2 * | 2/2010 | Hillis | ..................... G09G 3/001 445/24 |
| 10,784,246 B2 | 9/2020 | Do et al. | |
| 10,797,212 B2 | 10/2020 | Im et al. | |
| 10,910,512 B2 | 2/2021 | Sung | |
| 11,728,196 B2 | 8/2023 | Lee et al. | |
| 12,356,824 B2 * | 7/2025 | He | ........................ H10K 59/353 |

(Continued)

FOREIGN PATENT DOCUMENTS

| | | | |
|---|---|---|---|
| CN | 100572072 C | * | 12/2009 |
| JP | 2000223511 A | * | 8/2000 |

(Continued)

OTHER PUBLICATIONS

A schematic spraying mechanism of Method A (a) and Method B (b). Download Scientific Diagram. [online]. pp. 1-2 [retrieved on Aug. 2, 2022]. Retrieved from the Internet: <URL: https://www.researchgate.net/figure/A-schematic-spraying-mechanism-of-Method-A-a-and-Method-B-b_fig6_337365623.

(Continued)

*Primary Examiner* — Jeffrey T Carley
*Assistant Examiner* — Jose K Abraham
(74) *Attorney, Agent, or Firm* — CANTOR COLBURN LLP

(57) ABSTRACT

A display panel manufacturing method includes: applying a first solution onto a work substrate; applying, onto the first solution, a second solution including a plurality of light emitting elements; and applying an electric field to the work substrate. A viscosity of the first solution is different from a viscosity of the second solution.

20 Claims, 12 Drawing Sheets

(56) References Cited

U.S. PATENT DOCUMENTS

| | | | | |
|---|---|---|---|---|
| 2013/0082249 A1* | 4/2013 | Kawanami | | H10K 71/15 |
| | | | | 438/46 |
| 2015/0132496 A1* | 5/2015 | Son | | C09D 11/38 |
| | | | | 106/31.13 |
| 2018/0166510 A1* | 6/2018 | Lee | | H10K 59/35 |
| 2019/0245143 A1* | 8/2019 | Zhang | | B41J 2/12 |
| 2021/0320089 A1* | 10/2021 | Kang | | H01L 25/0753 |
| 2022/0085249 A1* | 3/2022 | Do | | H10H 20/831 |

FOREIGN PATENT DOCUMENTS

| | | | | | | |
|---|---|---|---|---|---|---|
| JP | 2009064642 A | * | 3/2009 | | | |
| KR | 101672781 B1 | | 11/2016 | | | |
| KR | 101814104 B1 | | 1/2018 | | | |
| KR | 1020190042130 A | | 4/2019 | | | |
| KR | 1020210056480 A | | 5/2021 | | | |
| KR | 1020210077847 A | | 6/2021 | | | |
| KR | 102282383 B1 | | 7/2021 | | | |
| KR | 1020220003691 A | | 1/2022 | | | |
| WO | WO-2020059988 A1 | * | 3/2020 | | | H05K 13/04 |
| WO | WO-2020149476 A1 | * | 7/2020 | | | H10H 20/857 |

OTHER PUBLICATIONS

AliExpress. [online]. pp. 1-4 [retrieved on Aug. 2, 2022]. Retrieved from the Internet: <URL: https://ko.aliexpress.com/item/1005002019417230.html.

AliExpress. [online]. pp. 1-5 [retrieved on Aug. 2, 2022]. Retrieved from the Internet: <URL: https://ko.aliexpress.com/item/1005002941773417.html.

Amruth, C. et al., Organic light emitting diodes (OLEDs) with slot die coated functional layers, DOI: 10.1039/D0MA00903B (Review Article) Mater. Adv., 2021, 2, 628 645 (35 Pages).

Are Quantum Nano Emitting Diodes (QNEDs) the Next Big Thing. [online]. pp. 1-2 [retrieved on Aug. 2, 2022]. Retrieved from the Internet: <URL: https://www.displaysupplychain.com/blog/are-quantum-nano-emitting-diodes-qneds-the-next-big-thing.

CNT, Nanowires & Other Nanomaterials CNT, Nanowires & Other Nanomaterials, Sono-Tek. [online]. pp. 1-6 [retrieved on Aug. 2, 2022]. Retrieved from the Internet: <URL: https://www.sono-tek.com/industry/alternative-energy-nanomaterials/cnt-nanowires-and-other-nanomaterials/.

How Ultrasonic Nozzles Work, Sono-Tek. [online]. pp. 1-2 [retrieved on Dec. 13, 2022]. Retrieved from the Internet: <URL: https://www.sono-tek.com/ultrasonic-coating/how-ultrasonic-nozzles-work/.

Patented Vortex Sprayer. [online]. pp. 1-4 [retrieved on Aug. 2, 2022]. Retrieved from the Internet: <URL: https://www.pierry.com/sprayer.

Schematic illustration of the spraying method. Download Scientific Diagram. [online]. pp. 1-6 [retrieved on Aug. 2, 2022]. Retrieved from the Internet: <URL: https://www.researchgate.net/figure/Schematic-illustration-of-the-spraying-method_fig1_339078386.

Show Tech + Powder Puffer 50 ml—Transgroom—Pet Care Professionals. [online]. pp. 1-6 [retrieved on Aug. 2, 2022]. Retrieved from the Internet: <URL: https://transgroom.com/en/products/show-tech-powder-duster-glass-spray-bottle-50-ml.

* cited by examiner

INKJET PRINTING APPARATUS AND DISPLAY PANEL MANUFACTURING METHOD USING THE SAME

This application claims priority to Korean Patent Application No. 10-2022-0037636, filed on Mar. 25, 2022, and all the benefits accruing therefrom under 35 U.S.C. § 119, the content of which in its entirety is herein incorporated by reference.

BACKGROUND

The present disclosure herein relates to an inkjet printing apparatus and a display panel manufacturing method using the same.

A light emitting diode ("LED") is a device that converts an electrical signal into a form of light, such as infrared light or visible light, by using characteristics of a compound semiconductor, and has been used for a home appliance, a remote controller, an electronic display board, various automated machines, etc. The light emitting diode is utilized in a wide range of the electronic device ranging from a small handheld electronic device to a large display device, and available fields for the light emitting diode are increasingly widened.

As part of studies for utilizing the light emitting diode, there has been developed a technology for manufacturing an ultra-small light emitting diode that is small in a microscale or nanoscale level. For example, a rod-type light emitting diode may be manufactured in a size small enough to constitute a pixel, or the like, of a self-emission display device.

During forming of a display panel with the ultra-small light emitting diode that is as small in a microscale or nanoscale level, the ultra-small light emitting element may be formed through an inkjet process.

SUMMARY

The present disclosure provides an inkjet printing apparatus, with which an alignment state of ultra-small light emitting elements is improved during a process of applying an electric field to align the ultra-small light emitting elements after coating the ultra-small light emitting elements through an inkjet process, and a display panel manufacturing method using the inkjet printing apparatus.

An embodiment of the invention provides a display panel manufacturing method including: applying a first solution onto a work substrate; applying, onto the first solution, a second solution including a plurality of light emitting elements; and applying an electric field to the work substrate. A viscosity of the first solution is different from a viscosity of the second solution.

In an embodiment, the viscosity of the first solution may be relatively higher than the viscosity of the second solution.

In an embodiment, the first solution may include a first solvent without the light emitting elements, and the second solution may include a second solvent including the light emitting elements. Each of the first solvent and the second solvent may include any one among acetone, water, alcohol, toluene, and organic matter.

In an embodiment, the applying of the electric field to the work substrate may start after the applying of the first solution and end after the applying of the second solution.

In an embodiment, the applying of the electric field to the work substrate may start after the applying of the second solution.

In an embodiment, the work substrate may include: a base layer, a circuit layer disposed on the base layer and including at least one transistor and at least one insulating layer, a partition wall disposed on the circuit layer and defining an inner space, and a first electrode and a second electrode at least partially disposed in the inner space and spaced apart from each other. The first solution and the second solution may be applied onto the inner space.

In an embodiment, each of the plurality of light emitting elements may be a bipolar element which includes a first semiconductor layer, a second semiconductor layer, an active layer disposed between the first semiconductor layer and the second semiconductor layer, and an insulating layer surrounding the first semiconductor layer, the second semiconductor layer, and the active layer.

In an embodiment, in the applying of the electric field to the work substrate, the plurality of light emitting elements may be aligned so that the first semiconductor layer overlaps the first electrode and the second semiconductor layer overlaps the second electrode in a thickness direction.

In an embodiment, the display panel manufacturing method may further include disposing, on the work substrate, a mask in which a mask opening portion corresponding to the inner space is defined. The first solution and the second solution may be sprayed toward the mask.

In an embodiment, the display panel manufacturing method may further include applying a magnetic force to the work substrate and the mask.

In an embodiment, the first electrode and the second electrode may be each provided in plurality, and the plurality of first electrodes and the plurality of second electrodes may be arranged alternately.

In an embodiment, the first solution may be provided through any one process among an inkjet printing process, a spray process, a slot-die coating process, and a screen-printing process.

In an embodiment, the second solution may be provided through any one process among an inkjet printing process, a spray process, an ultrasonic spray process, a powder spray process, a slot-die coating process, and a screen-printing process.

In an embodiment, the first solution and the second solution may be sprayed from different inkjet heads.

In an embodiment of the invention, an inkjet printing apparatus includes: a stage, on which a work substrate is disposed; a probe device, which provides an electric field to the work substrate; a first head, which sprays a first solution onto the work substrate; and a second head, which sprays a second solution onto the first solution. The second solution includes a plurality of light emitting elements, and a viscosity of the first solution is different from a viscosity of the second solution.

In an embodiment, a viscosity of the first solution may be relatively higher than a viscosity of the second solution.

In an embodiment, the probe device may form the electric field on the work substrate from after the first solution is sprayed, until after the second solution is sprayed.

In an embodiment, the probe device may form the electric field on the work substrate after the second solution is sprayed.

In an embodiment, the inkjet printing apparatus may further include a mask which is disposed on the work substrate and in which a plurality of mask opening portions are defined. The first solution and the second solution may pass through the mask opening portions to be applied onto the work substrate.

In an embodiment, the inkjet printing apparatus may further include an electrostatic chuck which is disposed below the stage and forms a magnetic force to couple the work substrate and the mask.

BRIEF DESCRIPTION OF THE FIGURES

The accompanying drawings are included to provide a further understanding of the invention, and are incorporated in and constitute a part of this specification. The drawings illustrate embodiments of the invention and, together with the description, serve to explain principles of the invention. In the drawings:

FIG. 5 is a cross-sectional view of a work substrate according to an embodiment of the invention;

FIG. 12 is a perspective view illustrating a coupled state of a mask and a work substrate according to an embodiment of the invention.

DETAILED DESCRIPTION

Figure 1:
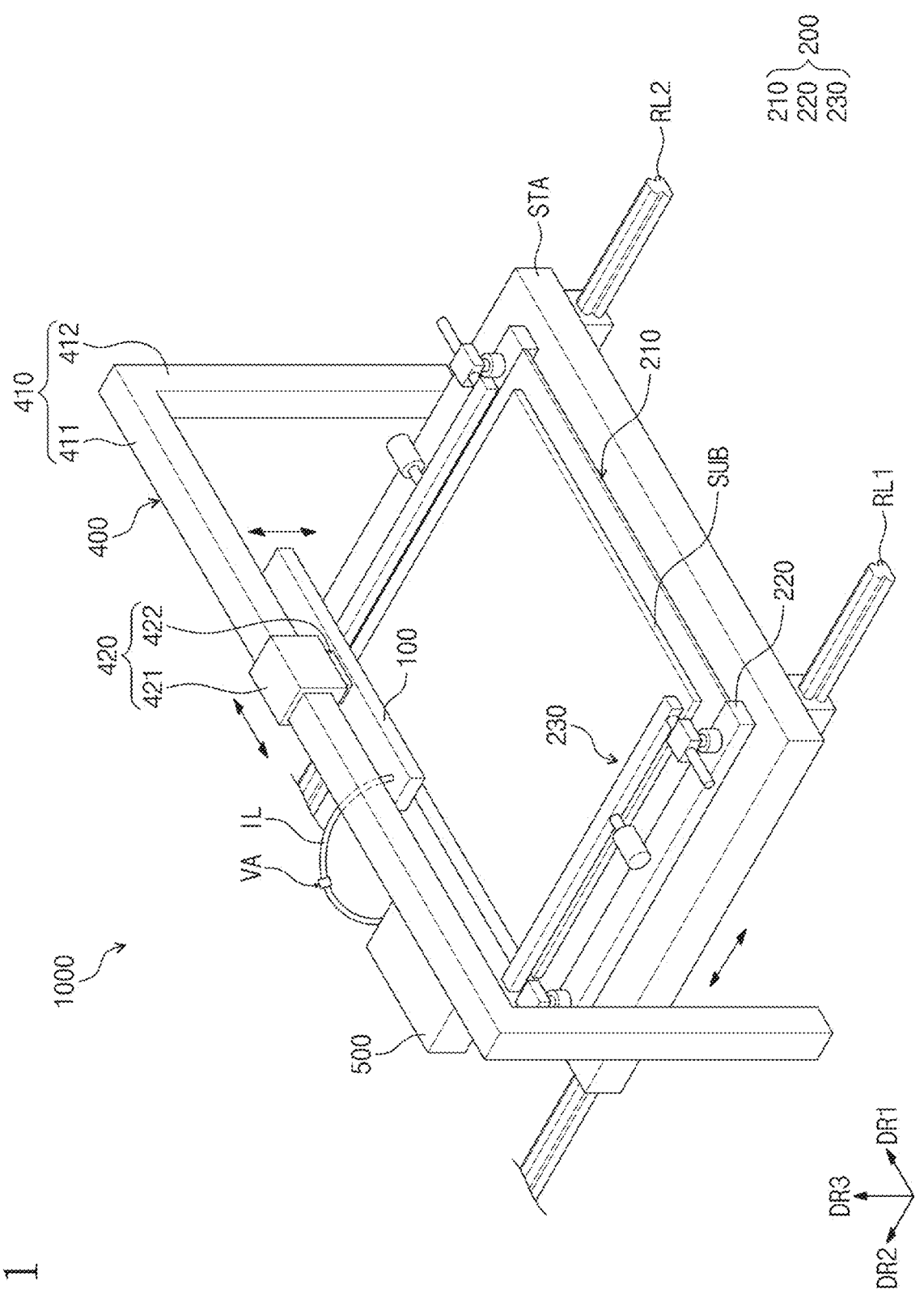
FIG. 1 is a perspective view of an inkjet printing apparatus according to an embodiment of the invention.

It will be understood that in this specification, when an element (or region, layer, section, etc.) is referred to as being "on", "connected to" or "coupled to" another element, it can be disposed directly on, connected or coupled to the other element or a third intervening element may be disposed between the elements.

Like reference numbers or symbols refer to like elements throughout. In addition, in the drawings, the thickness, the ratio, and the dimension of elements are exaggerated for effective description of the technical contents. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." The term "and/or" includes one or more combinations which may be defined by relevant elements.

It will be understood that, although the terms "first", "second", etc. may be used herein to describe various elements, these elements should not be limited by these terms. These terms are only used to distinguish one element from another element. For example, a first light-emitting element could be termed a second light-emitting element without departing from the teachings of the present invention, and similarly, a second light-emitting element could be termed a first light-emitting element. The singular forms are intended to include the plural forms as well, unless the context clearly indicates otherwise.

In addition, the terms, such as "below", "beneath", "on" and "above", are used for explaining the relation of elements shown in the drawings. The terms are relative concept and are explained based on the direction shown in the drawing.

It will be further understood that the terms such as "includes" or "has", when used herein, specify the presence of stated features, numerals, steps, operations, elements, parts, or the combination thereof, but do not preclude the presence or addition of one or more other features, numerals, steps, operations, elements, parts, or the combination thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the invention will be described with reference to the accompanying drawings.

Figure 2:
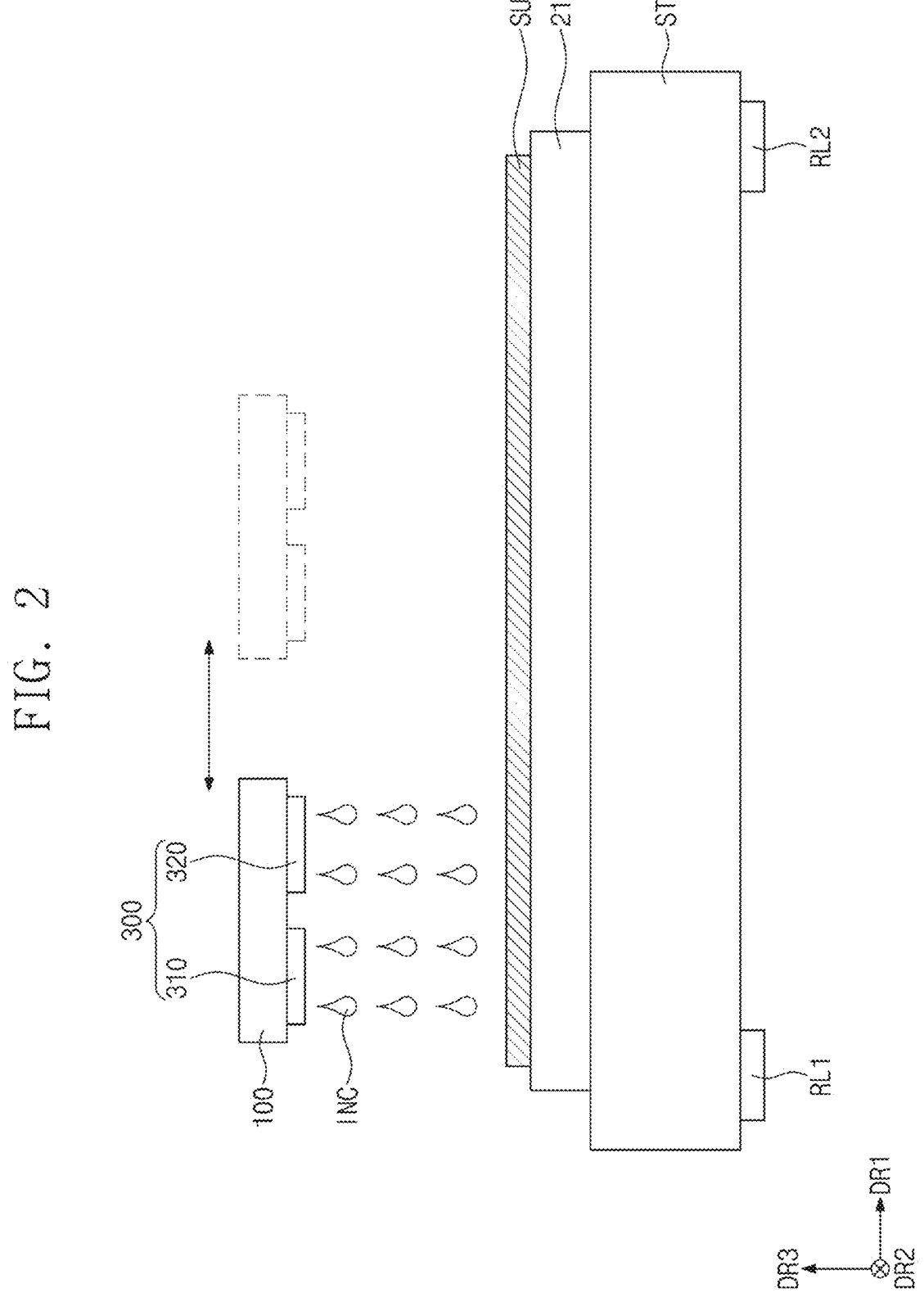
FIG. 2 is a cross-sectional view of some components of the inkjet printing apparatus according to an embodiment of the invention.
Figure 3:
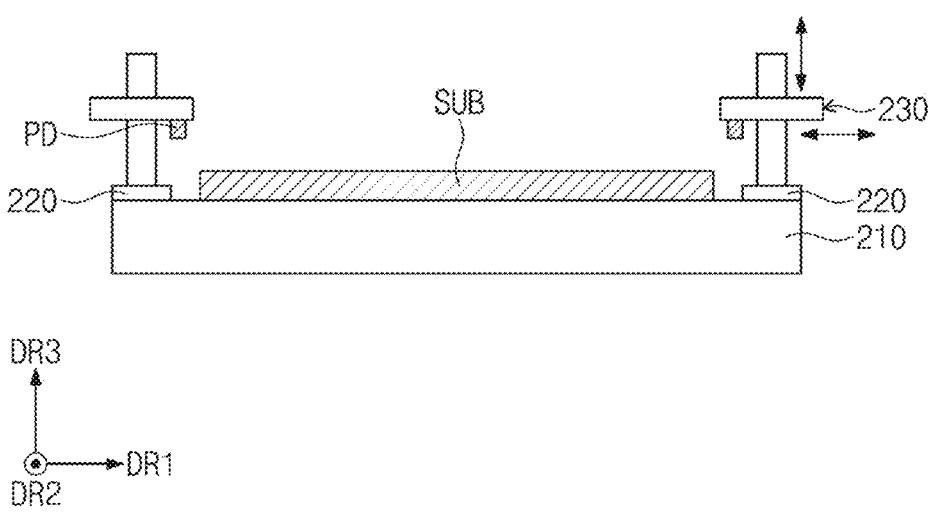
FIG. 3 is a cross-sectional view of some components of the inkjet printing apparatus according to an embodiment of the invention.
Figure 4:
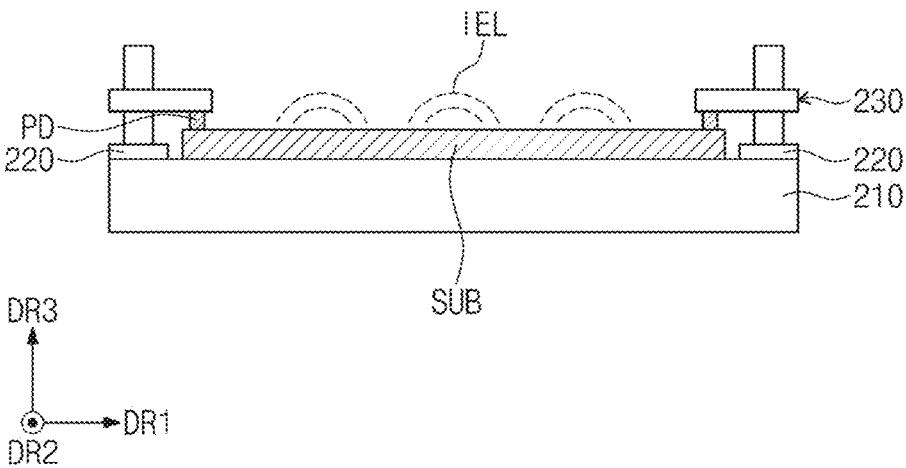
FIG. 4 is a cross-sectional view of some components of the inkjet printing apparatus according to an embodiment of the invention.

FIG. 1 is a perspective view of an inkjet printing apparatus according to an embodiment of the invention. FIG. 2 is a cross-sectional view of some components of the inkjet printing apparatus according to an embodiment of the invention. FIG. 3 is a cross-sectional view of some components of the inkjet printing apparatus according to an embodiment of the invention. FIG. 4 is a cross-sectional view of some components of the inkjet printing apparatus according to an embodiment of the invention.

Referring to FIGS. 1 to 4, an inkjet printing apparatus 1000 according to an embodiment may include a support plate STA, a printhead unit 100 including a plurality of inkjet heads 300, an ink reservoir 500, a stage 200, and a base frame 400.

The support plate STA may be provided in a plate shape extending in a first direction DR1 and in a second direction DR2. In an embodiment of the invention, the first direction DR1 and the second direction DR2 defines a plane, and are perpendicular to each other, and a third direction DR3 is perpendicular to each of the first direction DR1 and the second direction DR2 (e.g., perpendicular to the plane defined by the first and second directions DR1 and DR2). It may be understood that the first direction DR1 refers to a horizontal direction on the drawings, the second direction DR2 refers to a vertical direction on the drawings, and the third direction DR3 refers to a thickness direction of one component on the drawings.

The stage 200, on which a work substrate SUB is disposed, may be coupled onto the support plate STA. The stage 200 may include a probe device 230. The inkjet printing apparatus 1000 includes a first rail RL1 and a second rail RL2 which each extend in the second direction DR2 and are spaced apart from each other in the first direction DR1. The support plate STA is disposed on the first rail RL1 and the second rail RL2.

The support plate STA may reciprocate in the second direction DR2 through a separate actuating member such as a motor, on the first rail RL1 and the second rail RL2. Thus, the stage 200 having the work substrate SUB disposed thereon and the probe device 230 may reciprocate on the support plate STA in the second direction DR2.

As the stage 200 reciprocates in the second direction DR2 in a state of being coupled to the support plate STA, an ink INC sprayed from the printhead unit 100 may be applied onto the work substrate SUB. FIG. 1 illustrates a structure in which the support plate STA moves. However, in an embodiment, the support plate STA may be fixed, and the printhead unit 100 may move. In this case, the printhead unit 100 may be mounted on a frame disposed on the first rail RL1 and the second rail RL2.

The stage 200 may include a main substrate 210, a probe support 220, and the probe device 230. The main substrate 210 may provide a space for disposing the work substrate SUB thereon. The probe support 220 may be disposed on one side of the main substrate 210, and extend along an edge of the main substrate 210 in the second direction DR2 to provide a space for attaching the probe device 230. However, an embodiment of the invention is not limited thereto. In another embodiment, additional probe supports 220 may be further included, and in some cases, the probe supports 220 may be disposed on both an upper surface and a lower side of the main substrate 210. That is, the probe support 220 may have a structure varying depending on the number of the probe device 230 included in the stage 200, or the arrangement or structure thereof, or the like.

The probe device 230 may form an electric field on the work substrate SUB with the sprayed ink INC. The electric field may be delivered to the ink INC sprayed onto the work substrate SUB. Each of bipolar elements included in the ink INC may be arranged in the same direction.

The inkjet printing apparatus 1000 may spray a predetermined ink INC onto the work substrate SUB by using the printhead unit 100. The probe device 230 may generate an electric field on the work substrate with the sprayed ink INC, and light emitting elements included in the ink INC may be arranged on the work substrate SUB. Each of the light emitting elements according to an embodiment of the invention may be a particle such as a bipolar element. Thus, when the electric field is formed on the work substrate SUB, each of the light emitting elements may be arranged in a predetermined direction to correspond to the polarity of the bipolar element.

The printhead unit 100 may include at least one inkjet head 300 and be disposed on the base frame 400. The printhead unit 100 may use the inkjet head 300, which is connected to the separate ink reservoir 500, to spray the predetermined ink INC onto the target substrate SUB provided on the probe device 230. The inkjet head 300 may spray, eject, or print the ink INC including the bipolar element onto the work substrate SUB.

The inkjet head 300 according to an embodiment may further include a sensing unit capable of maintaining the number of the bipolar elements per droplet of the ink INC ejected from the inkjet head 300, uniformly.

The base frame 400 may include a support part 410 and a moving unit 420. The support part 410 may include a first support part 411 extending in the first direction DR1 that is a horizontal direction, and a second support part 412 connected to the first support part 411 and extending in the third direction DR3 that is a vertical direction. The first support part 411 may extend in the first direction DR1. The printhead unit 100 may be disposed under the moving unit 420 mounted on the first support part 411.

The moving unit 420 may include a mobile part 421, which is mounted on the first support part 411 and movable in the first direction DR1, and a fixing part 422, which is disposed on a lower surface of the mobile part 421 and on which the printhead unit 100 is disposed. The printhead unit 100 may be fixed on the fixing part 422 to move in the first direction DR1 together with the mobile part 421.

The printhead unit 100 may be coupled to the base frame 400 and spray the ink INC provided from the ink reservoir 500 onto the work substrate SUB through the inkjet head 300. The printhead unit 100 may be spaced apart from the work substrate SUB by a predetermined gap. The spaced gap between the printhead unit 100 and the work substrate SUB may be adjusted by the height of the second support part 412 of the base frame 400.

The printhead unit 100 may include the inkjet heads 300, each of which includes at least one nozzle. The inkjet heads 300 may be disposed on a lower surface of the printhead unit 100.

The inkjet heads 300 may be disposed apart from each other in one direction (e.g., the first direction DR1) and may be disposed in a single row or a plurality of rows. In this embodiment, each of the inkjet heads 300 may include a first head 310 and a second head 320. Each of the first head 310 and the second head 320 may be provided in plurality to form one group.

According to an embodiment of the invention, the first head 310 and the second head 320 may spray the ink INC having different viscosities onto the work substrate SUB. The ink INC sprayed from each of the first head 310 and the second head 320 may be provided in a solution or colloid state. According to this embodiment, a solution provided from the first head 310 may have a relatively higher viscosity than a solution provided from the second head 320. The solution provided from the first head 310 may include a solvent alone, and the solution provided from the second head 320 may include bipolar elements and a solvent in which the bipolar elements are dispersed.

The solvent included in the solution sprayed from the first head 310, and the solvent included in the solution sprayed from the second head 320, may each include any one among acetone, water, alcohol, toluene, propylene glycol ("PG"), propylene glycol methyl acetate ("PGMA"), diethylene glycol monopropyl ether ("DGPE"), and t-butyl glycidyl ether ("TGBE"). The bipolar elements included in the second head 320 may have a concentration of about 0.01 percentages by weight (wt %) to about 10 wt %.

In the inkjet printing apparatus 1000 according to an embodiment of the invention, in sequence, the first head 310 may spray the solution having a relatively high viscosity onto the work substrate SUB, and then the second head 320 may spray the solution including the bipolar elements onto the work substrate SUB. Accordingly, due to the solution sprayed from the first head 310, the time for the bipolar elements to settle onto the work substrate SUB may be delayed. This will be described later.

The inkjet printing apparatus 1000 may further include the ink reservoir 500. The ink reservoir 500 may supply the ink INC to the printhead unit 100 through a connection pipe IL and may adjust an ejected amount of the ink INC through a valve VA disposed in the connection pipe IL. The ink reservoir 500 according to an embodiment may further include an additional connection pipe capable of re-supplying, to the ink reservoir 500, an amount of the ink remaining after being ejected from the inkjet head 300.

FIG. 1 illustrates that the ink reservoir 500 is mounted on the base frame 400, but an embodiment of the invention is not limited thereto. The ink reservoir 500 may be provided in the inkjet printing apparatus 1000, but the position or shape thereof is not particularly limited. For example, the ink reservoir 500 may be disposed in a separate device, and may be variously disposed within a range in which the ink reservoir 500 is connected to the inkjet head 300 in another embodiment.

Referring to FIGS. 3 and 4, the probe device 230 may be operated according to processing stages for the inkjet printing apparatus 1000. In a first state where the electric field is not formed by the probe device 230, the probe device 230 may be disposed on the probe support 220 and spaced apart from the work substrate SUB. The probe device 230 may be driven through a driving unit in the first direction DR1 that is a horizontal direction and in the third direction DR3 that is a vertical direction, thereby allowing a pad PD in contact with the work substrate SUB to be spaced apart from the work substrate SUB.

In a second state where the electric field is formed on the work substrate SUB, the driving unit of the probe device 230 may be driven to allow the pad PD to be in contact with the work substrate SUB. The driving unit may be driven in the third direction DR3 that is a vertical direction and in the first direction DR1 that is a horizontal direction, thereby allowing the pad PD to be in contact with the work substrate SUB. Here, the probe device 230 may deliver an electrical signal to the pad PD, and accordingly an electric field IEL may be formed on the work substrate SUB.

Figure 5:
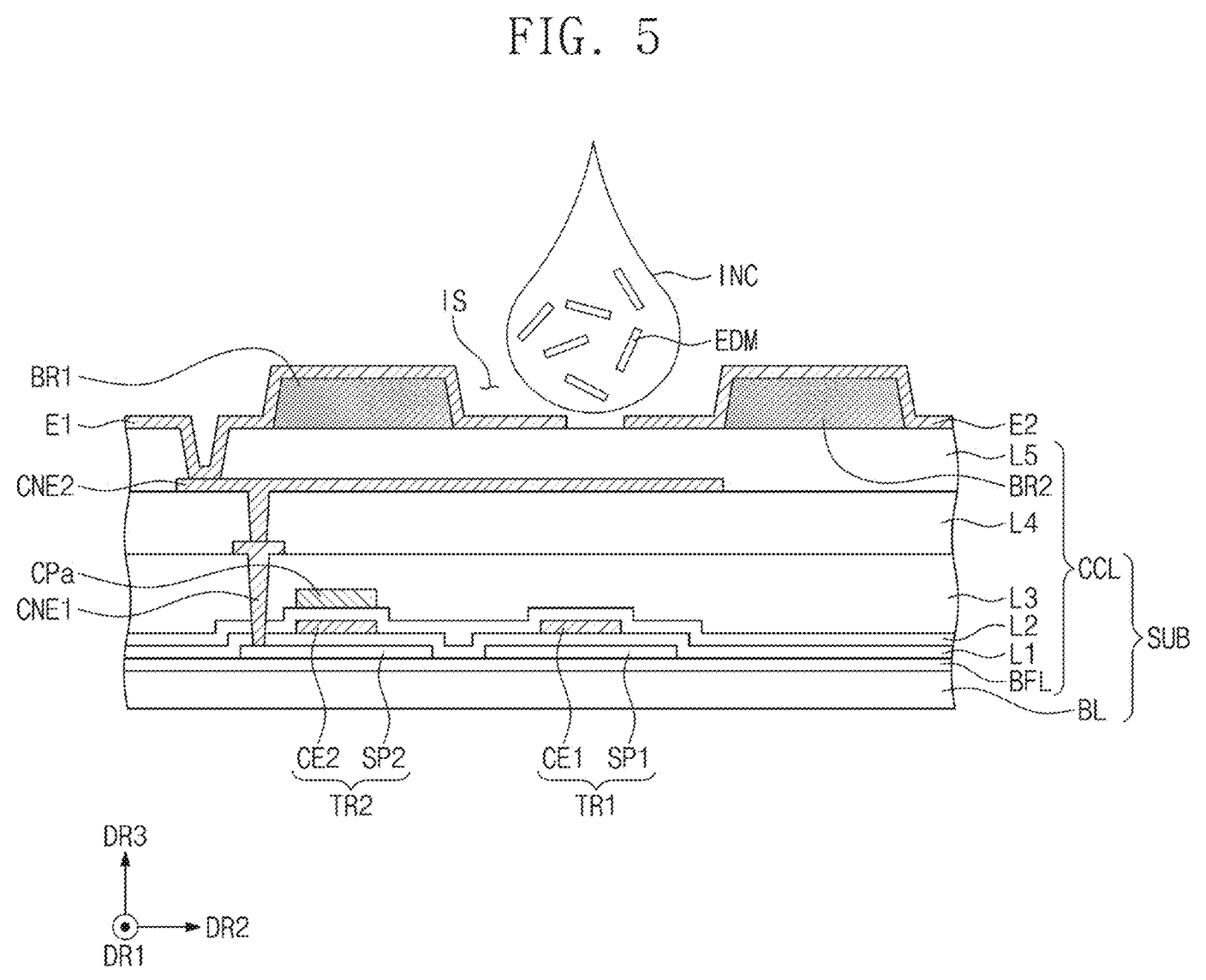
Figure 6:
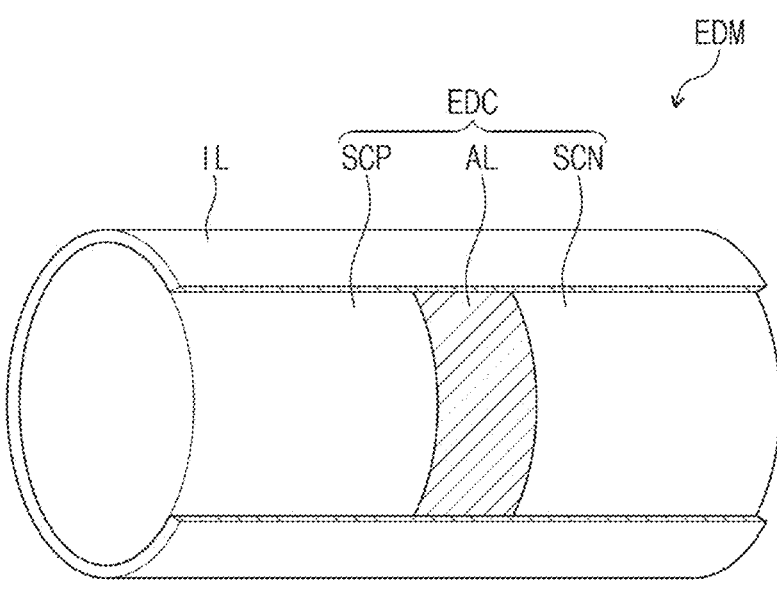
FIG. 6 is a perspective view of a light emitting element according to an embodiment of the invention.

FIG. 5 is a cross-sectional view of a work substrate according to an embodiment of the invention. FIG. 6 is a perspective view of a light emitting element according to an embodiment of the invention.

In the inkjet printing apparatus 1000 (see FIG. 1) according to an embodiment of the invention, a work substrate SUB on which a printing process is performed may be provided in a state where some components are formed, before a display panel is completed. For example, referring to FIG. 5, the work substrate SUB may be provided in a state where a circuit layer CCL is formed on a base layer BL and before light emitting elements are applied onto the circuit layer CCL.

The base layer BL may be a stacked structure which includes a silicon substrate, a plastic substrate, a glass substrate, an insulating film, or a plurality of insulating layers.

The circuit layer CCL may be disposed on the base layer BL. The circuit layer CCL may include a stacked structure which includes a plurality of insulating layers, a plurality of transistors, and a plurality of electrodes. For example, the circuit layer CCL may include a buffer layer BFL, a first insulating layer L1, a first thin film transistor TR1, a second thin film transistor TR2, a second insulating layer L2, a third insulating layer L3, a fourth insulating layer L4, a first connection electrode CNE1, a second connection electrode CNE2, and a fifth insulating layer L5.

The buffer layer BFL may be disposed on the base layer BL. The first thin film transistor TR1 and the second thin film transistor TR2 may be disposed on the buffer layer BFL.

The first thin film transistor TR1 may include a first control electrode CE1 and a first semiconductor pattern SP1. The second thin film transistor TR2 may include a second control electrode CE2 and a second semiconductor pattern SP2. The first semiconductor pattern SP1 and the second semiconductor pattern SP2 may each include a doped region and a non-doped region. The doped region may be doped with an N-type dopant or a P-type dopant. The first semiconductor pattern SP1 and the second semiconductor pattern SP2 may each include a source, an active, and a drain. The non-doped region may substantially correspond to an active (or channel) of the transistor. That is, a part of the semiconductor pattern may be an active of the transistor, and another part may be a source or drain of the transistor. Although not illustrated, the first thin film transistor TR1 and the second thin film transistor TR2 may each further include an input electrode and an output electrode which are connected to the source and the drain.

The first semiconductor pattern SP1 and the second semiconductor pattern SP2 may be disposed on the buffer layer BFL. The buffer layer BFL may provide, with a reformed surface, each of the first semiconductor pattern SP1 and the second semiconductor pattern SP2. In this case, the first semiconductor pattern SP1 and the second semiconductor pattern SP2 may have a higher adhesion to the buffer layer BFL, compared to when being formed directly on the base layer BL. Alternatively, the buffer layer BFL may serve as a barrier layer which protects a lower surface of each of the first semiconductor pattern SP1 and the second semiconductor pattern SP2. In this case, the buffer layer BFL may block pollutants or moisture, etc., introduced from the base layer BL itself or introduced through the base layer BL, from being penetrated into the first semiconductor pattern SP1 and the second semiconductor pattern SP2.

The first insulating layer L1 may be disposed on the buffer layer BFL and cover the first semiconductor pattern SP1 and the second semiconductor pattern SP2. The first insulating layer L1 may include an inorganic matter. The inorganic matter may be, for example, a silicon nitride, a silicon oxynitride, a silicon oxide, a titanium oxide, or an aluminum oxide, but is not limited thereto.

The first control electrode CE1 and the second control electrode CE2 may be disposed on the first insulating layer L1. The second insulating layer L2 may be disposed on the first insulating layer L1 and cover the first control electrode CE1 and the second control electrode C. The second insulating layer L2 may include an inorganic matter.

A capacitor may include a first cap electrode (not illustrated) and a second cap electrode CPa. For example, the first cap electrode may be branched from the second control electrode CE2, and the second cap electrode CPa may be disposed on the second insulating layer L2.

The third insulating layer L3 is disposed on the second insulating layer L2 and covers the second cap electrode CPa. The first connection electrode CNE1 may be disposed on the third insulating layer L3. The first connection electrode CNE1 may be connected to the second semiconductor pattern SP2 through through-holes passing through the first to third insulating layers L1, L2 and L3. The first connection electrode CNE1 may be connected to a drain of the second semiconductor pattern SP2. Although not illustrated, the circuit layer CCL may further include a connection signal line connected to the drain of the second semiconductor pattern SP2, and the first connection electrode CNE1 may be connected to the connection signal line. Not only the first connection electrode CNE1 but also signal wiring, for example, at least a portion of respective scan lines or data lines, may be disposed on the third insulating layer L3.

The fourth insulating layer L4 may be disposed on the third insulating layer L3 and cover the first connection electrode CNE1. The fourth insulating layer L4 may be a single layer or a plurality of layers, and the fourth insulating layer L4 may include organic matter and/or inorganic matter.

The second connection electrode CNE2 may be disposed on the fourth insulating layer L4. Not only the second connection electrode CNE1 but also signal wiring, for example, at least other portions of the respective scan lines or data lines, may be disposed on the fourth insulating layer L4. The second connection electrode CNE2 may be connected to the first connection electrode CNE1.

The fifth insulating layer L5 may be disposed on the fourth insulating layer L4 and cover the second connection electrode CNE2. The fifth insulating layer L5 may include an organic matter. The fifth insulating layer L5 may cover a pixel circuit to be disposed therebelow and provide a flat surface.

A first partition wall portion BR1 and a second partition wall portion BR2 are disposed on the fifth insulating layer L5. The first partition wall portion BR1 and the second partition wall portion BR2 may each extend in the first direction DR1. The second partition wall portion BR2 may be spaced apart from the first partition wall portion BR1 in the second direction DR2. The first partition wall portion BR1 and the second partition wall portion BR2 may define an inner space IS therebetween. The first partition wall portion BR1 and the second partition wall portion BR2 may include the same material. For example, the first partition wall portion BR1 and the second partition wall portion BR2 may each include an organic material.

A first electrode E1 may be disposed on the first partition wall portion BR1, and a second electrode E2 may be disposed on the second partition wall portion BR2. The first electrode E1 may cover the first partition wall portion BR1, and the second electrode E2 may cover the second partition wall portion BR2. That is, the first partition wall portion BR1 may be disposed between the first electrode E1 and the fifth insulating layer L5, and the second partition wall portion BR2 may be disposed between the second electrode E2 and the fifth insulating layer L5. A part of the first electrode E1 and a part of the second electrode E2 may be disposed in the inner space IS and be spaced apart from each other.

The fifth insulating layer L5 may be provided with a through-hole, and the second connection electrode CNE2 may be exposed by the through-hole. The first electrode E1 may be electrically connected to the second connection electrode CNE2 to be exposed.

Each of the first electrode E1 and the second electrode E2 may have a single-layer structure or may have a stacked structure in which a plurality of layers is stacked. For example, the first electrode E1 and the second electrode E2 may each include a reflective electrode (not illustrated) and a capping electrode (not illustrated) disposed on the reflective electrode. The reflective electrode may have a single-layer structure or may have a stacked structure in which a plurality of layers is stacked. For example, the reflective electrode may have a structure in which indium tin oxide ("ITO"), silver (Ag), and indium tin oxide (ITO) are stacked in sequence. However, this is an example, and an embodiment of the invention is not limited thereto. The capping electrode may cap the reflective electrode. The capping electrode may include at least one of an indium zinc oxide ("IZO"), an indium tin oxide (ITO), an indium gallium oxide ("IGO"), an indium gallium zinc oxide ("IGZO"), or a mixture/compound thereof.

FIG. 5 illustrates that a pair of the first electrode E1 and the second electrode E2 are disposed between the first partition wall portion BR1 and the second partition wall portion BR2. However, an embodiment of the invention is not limited thereto. The first electrode E1 and the second electrode E2 may be each provided in plurality, and a plurality of electrodes E1 and a plurality of second electrodes E2 may each extend in the first direction DR1 and be arranged apart in the second direction DR2. In addition, the first electrodes E1 and the second electrodes E2 may be arranged alternately along the second direction DR2, and are not limited to any one embodiment.

The inkjet printing apparatus 1000 according to an embodiment of the invention may be used in a process of applying, onto the work substrate SUB, an ink INC including light emitting elements EDM.

Referring to FIG. 6, each of the light emitting elements EDM may have various shapes such as a cylindrical shape or a polygonal column shape. FIG. 6 illustrates an LED element having a cylindrical shape as an example of the light emitting element EDM. However, an embodiment of the invention is not limited thereto, and the light emitting element EDM may have various polygonal column shapes including a cuboid shape in another embodiment. The light emitting element EDM may have a rod-like shape elongated in the longitudinal direction.

The light emitting element EDM according to an embodiment includes a semiconductor layer SCP and SCN, and an active layer AL. The light emitting element EDM may include a first semiconductor layer SCN, a second semiconductor layer SCP, and the active layer AL. The active layer AL may be disposed between the first semiconductor layer SCN and the second semiconductor layer SCP. The light emitting element EDM may further include, in addition to a core part EDC composed of the semiconductor layers SCP and SCN and the active layer AL, an insulating layer IL which covers a side portion of the core part EDC. For convenience of description, FIG. 6 exemplarily illustrates that the insulating layer IL exposes a portion of the side portion of the core part EDC and covers the other portion. However, an embodiment of the invention is not limited thereto, and the insulating layer IL may cover the entirety of the side portion of the core part EDC. That is, the side portion of the core part EDC, which is included in the light emitting element EDM, may be fully covered by the insulating layer IL and may not be exposed to the outside.

The first semiconductor layer SCN may be an n-type semiconductor layer provided by doping a semiconductor layer with an n-type dopant. The second semiconductor layer SCP may be a p-type semiconductor layer provided by doping a semiconductor layer with a p-type dopant. The semiconductor layer may include a semiconductor material. The semiconductor material may be, for example, GaN, AlGaN, InGaN, InN, InAlGaN, or AlInN, and is not limited thereto. The n-type dopant may be silicon (Si), germanium (Ge), tin (Sn), selenium (Se), tellurium (Te), or a combination thereof, and is not limited thereto. The p-type dopant may be magnesium (Mg), zinc (Zn), calcium (Ca), strontium (Sr), barium (Ba), or a combination thereof, and is not limited thereto.

The active layer AL may be formed in at least one of a single quantum well structure, a multi quantum well structure, a quantum wire structure, or a quantum dot structure. The active layer AL may be an area in which electrons injected through the first semiconductor layer SCN and holes injected through the second semiconductor layer SCP are recombined. The active layer AL is a layer emitting light having energy determined by an intrinsic energy band of a material. The position of the active layer AL may be variously changed depending on the type of a diode.

The light emitting element EDM may have a length between several hundred nanometers and several hundred micrometers. The length of the light emitting element EDM may be, for example, between about 1 micrometer and about 100 micrometers.

The light emitting element EDM may have a width between several nanometers and several micrometers. The width of the light emitting element EDM may be, for example, between about 20 nanometers and about 1 micrometer.

The insulating layer IL may cover side portions of the first semiconductor layer SCN, the second semiconductor layer SCP, and the active layer AL, and protect outer surfaces of the first semiconductor layer SCN, the second semiconductor layer SCP, and the active layer AL. In another embodiment of the invention, the insulating layer IL may cover only the active layer AL. The insulating layer IL may include a metal oxide. For example, the insulating layer IL may include at least one insulating material selected from the group consisting of a silicon nitride, a silicon oxynitride, a silicon oxide, a titanium oxide, and an aluminum oxide. However, an embodiment of the invention is not limited thereto.

The light emitting element EDM according to an embodiment may further include a contact electrode, which is disposed in at least one of the first semiconductor layer SCN or the second semiconductor layer SCP and includes a metal or an alloy of metals, and is not limited to any one embodiment.

A dielectrophoretic force may be delivered to the light emitting elements EDM under a predetermined electric field as in the second state described in FIG. 4. Thus, the light emitting elements EDM applied onto the work substrate SUB may be aligned to settle on the work substrate SUB while the position and orientation direction thereof are changed due to the electric field IEL generated by the probe device 230. For example, the first semiconductor layer SCN may be aligned to overlap a first electrode E1, and the second semiconductor layer SCP may be aligned to overlap a second electrode E2 in the thickness direction (i.e., the third direction DR3).

Here, the light emitting elements EDM may settle on the work substrate SUB while sinking in a solvent of the ink INC, and as a sinking time of the light emitting elements EDM is shorter, a time required for adjacent light emitting elements EDM to be aligned with corresponding electrodes becomes more unsatisfied, and thus this may cause a defect in which adjacent light emitting elements EDM are in contact with each other. Accordingly, a method to increase the sinking time of the light emitting elements EDM in the solvent of the ink INC is desirable.

Hereinafter, a display panel manufacturing method, with which the sinking time of the light emitting elements EDM is increased using the inkjet printing apparatus 1000 according to an embodiment of the invention, will be described.

Figure 7:
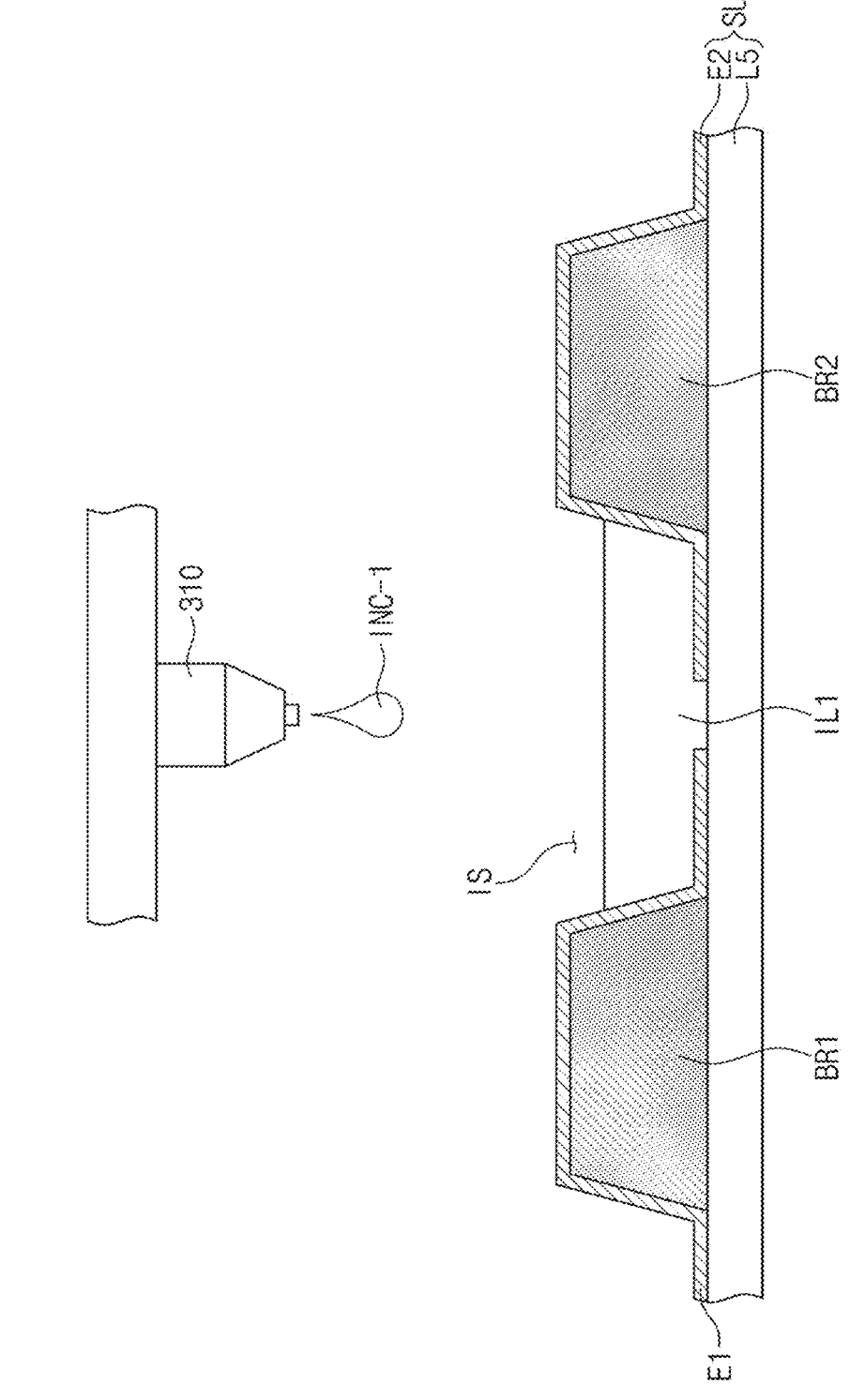
FIG. 7 is a cross-sectional view illustrating a display panel manufacturing method according to an embodiment of the invention.
Figure 8:
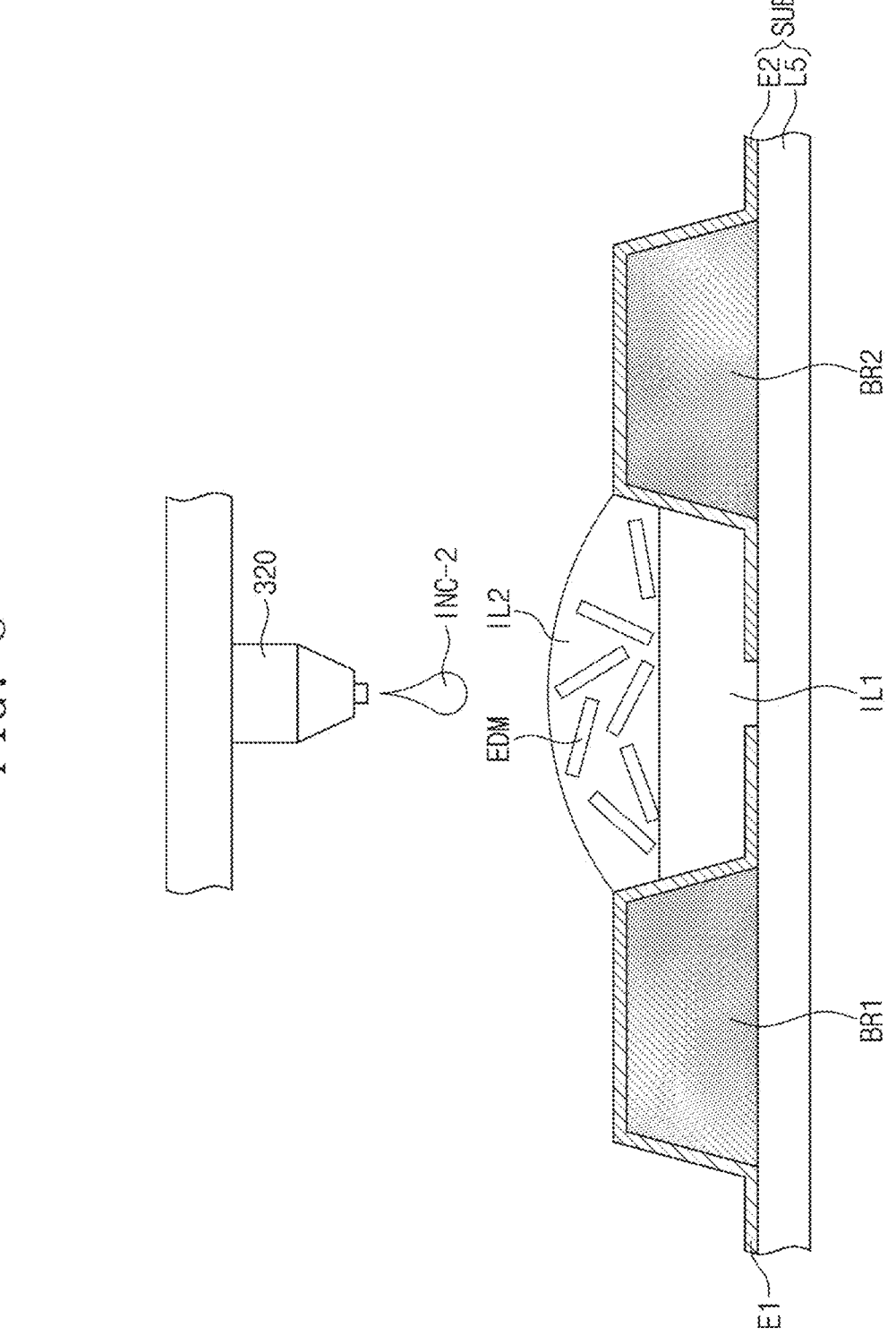
FIG. 8 is a cross-sectional view illustrating the display panel manufacturing method according to an embodiment of the invention.
Figure 9:
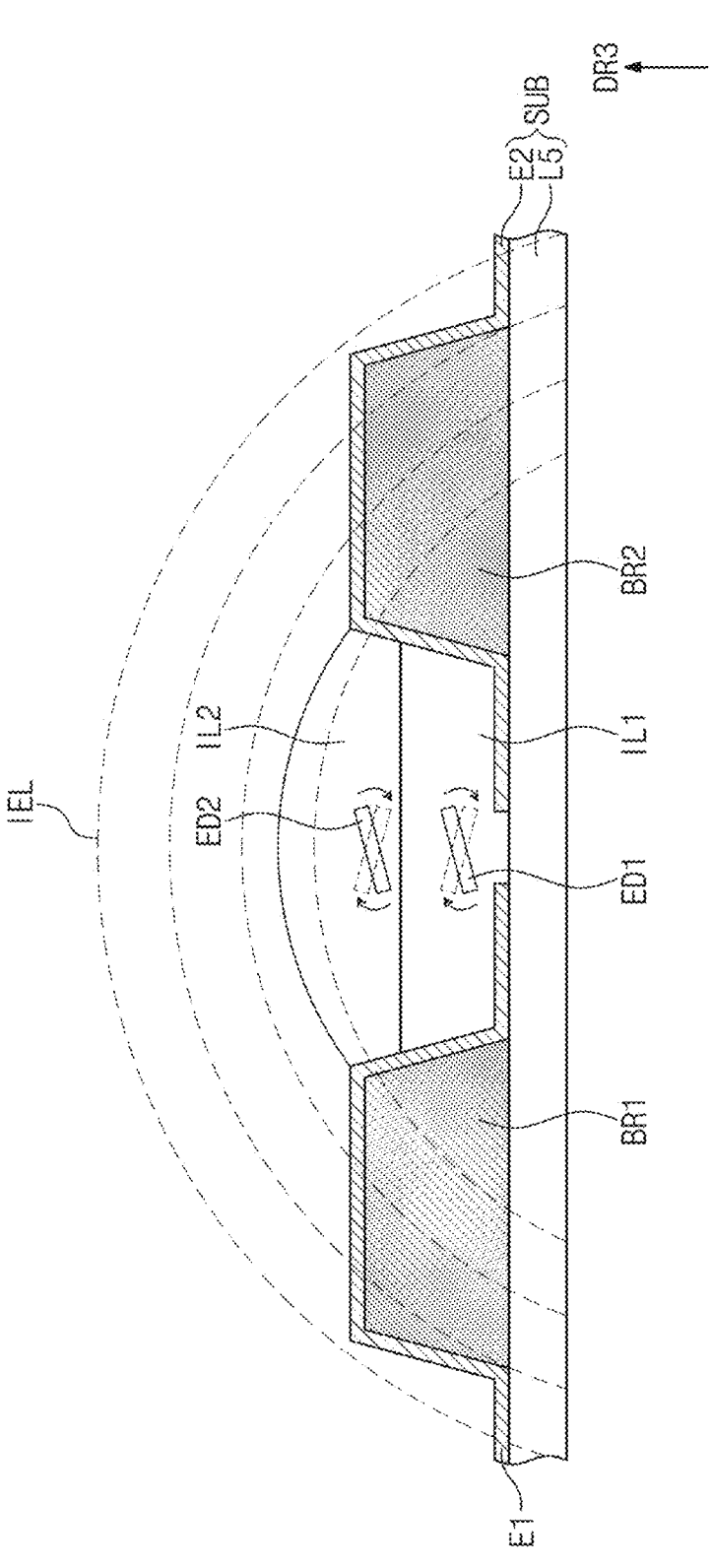
FIG. 9 is a cross-sectional view illustrating the display panel manufacturing method according to an embodiment of the invention.

FIG. 7 is a cross-sectional view illustrating a display panel manufacturing method according to an embodiment of the invention. FIG. 8 is a cross-sectional view illustrating the display panel manufacturing method according to an embodiment of the invention. FIG. 9 is a cross-sectional view illustrating the display panel manufacturing method according to an embodiment of the invention.

The display panel manufacturing method according to an embodiment of the invention may include applying a first solution IL1 onto a work substrate SUB, applying, onto the first solution ILL a second solution IL2 including a plurality of light emitting elements EDM, and applying an electric field IEL to the work substrate SUB.

Referring to FIG. 7, the first solution IL1 may be applied onto the work substrate SUB by spraying a first ink INC-1 through a first head 310. The first solution IL1 may be applied onto the insides of a first partition wall BR1 and a second partition wall BR2 (i.e., the inner space IS defined between the first partition wall BR1 and the second partition wall BR2). According to an embodiment, in order to eject the first ink INC-1 between the first partition wall BR1 and the second partition wall BR2, the first head 310 may spray the first ink INC-1 through an inkjet printing process. Thus, an accurate amount of ink may be ejected onto in a desired position.

However, an embodiment of the invention is not limited thereto, and the first head 310 may spray the first ink INC-1 through any one process among a spray process, a slot-die coating process, and a screen-printing process in another embodiment.

Thereafter, referring to FIG. 8, the second solution IL2 may be applied onto the first solution IL1 by spraying a second ink INC-2 through a second head 320. The second solution IL2 may be applied onto the insides (i.e., the inner space IS defined between the first partition wall BR1 and second partition wall BR2) of the first partition wall BR1 and the second partition wall BR2 and disposed on the first solution IL1. According to an embodiment, in order to eject the second ink INC-2 between the first partition wall BR1 and the second partition wall BR2, the second head 320 may spray the second ink INC-2 through an inkjet printing process.

However, an embodiment of the invention is not limited thereto, and the second head 320 may spray the second ink INC-2 through any one process among a spray process, an ultrasonic spray process, a powder spray process, a slot-die coating process, and a screen-printing process in another embodiment.

According to an embodiment of the invention, the first solution IL1, with which the work substrate SUB is pre-coated, may include a solvent alone, and the second solution IL2 may include the light emitting elements EDM and a solvent. In addition, the first solution IL1 may have a relatively higher viscosity than the second solution IL2.

Thereafter, the applying of the electric field IEL to the work substrate SUB may be performed through the probe device 230 described in FIG. 4.

If a difference in orientation directions and disposed positions of the light emitting elements EDM is large when the electric field IEL is applied to the work substrate SUB, or if there are light emitting elements EDM in contact with each other due to misalignment among the light emitting elements EDM, this may be determined that a degree of alignment of the light emitting elements EDM is low.

Applying the electric field IEL to the work substrate SUB may start after the applying of the first solution IL1 onto the work substrate SUB, and continue even after applying the second solution IL2, and applying the electric field IEL ends after the light emitting elements EDM are aligned.

However, an embodiment of the invention is not limited thereto. The time of applying of the electric field IEL to the work substrate SUB may start before the applying of the first solution IL1 or after the applying of the second solution IL2, and is not limited to any one embodiment.

FIG. 9 exemplarily illustrates a process in which a first light-emitting element ED1 and a second light-emitting element ED2 included in different positions are aligned in a state where the electric field IEL is applied to the work substrate SUB. The first light-emitting element ED1 may be located relatively more adjacent to the first solution IL1 than the second light-emitting element ED2 is. For example, the first light-emitting element ED1 may be located in the first solution IL1, and the second light-emitting element ED2 may be located in the second solution IL2. When the electric field IEL is applied to the work substrate SUB, the semiconductor layers SCP and SCN (see FIG. 6) of each of the first light-emitting element ED1 and the second light-emitting element ED2 sink in a direction from the second solution IL2 toward the first solution IL', while being arranged and aligned toward corresponding electrodes E1 and E2.

In the display panel manufacturing method according to an embodiment of the invention, the first solution IL1 having a relatively high viscosity may be applied in a pre-process, and then the second solution IL2 including the light emitting elements ED1 and ED2 may be applied in a post-process, thereby increasing the time required for aligning the first light-emitting element ED1 on the work substrate SUB, i.e., the sinking time for which the first light-emitting element ED1 settles on the work substrate SUB through the first solution IL1. Accordingly, the defect in which the light emitting elements overlap each other may be effectively reduced.

Figure 10:
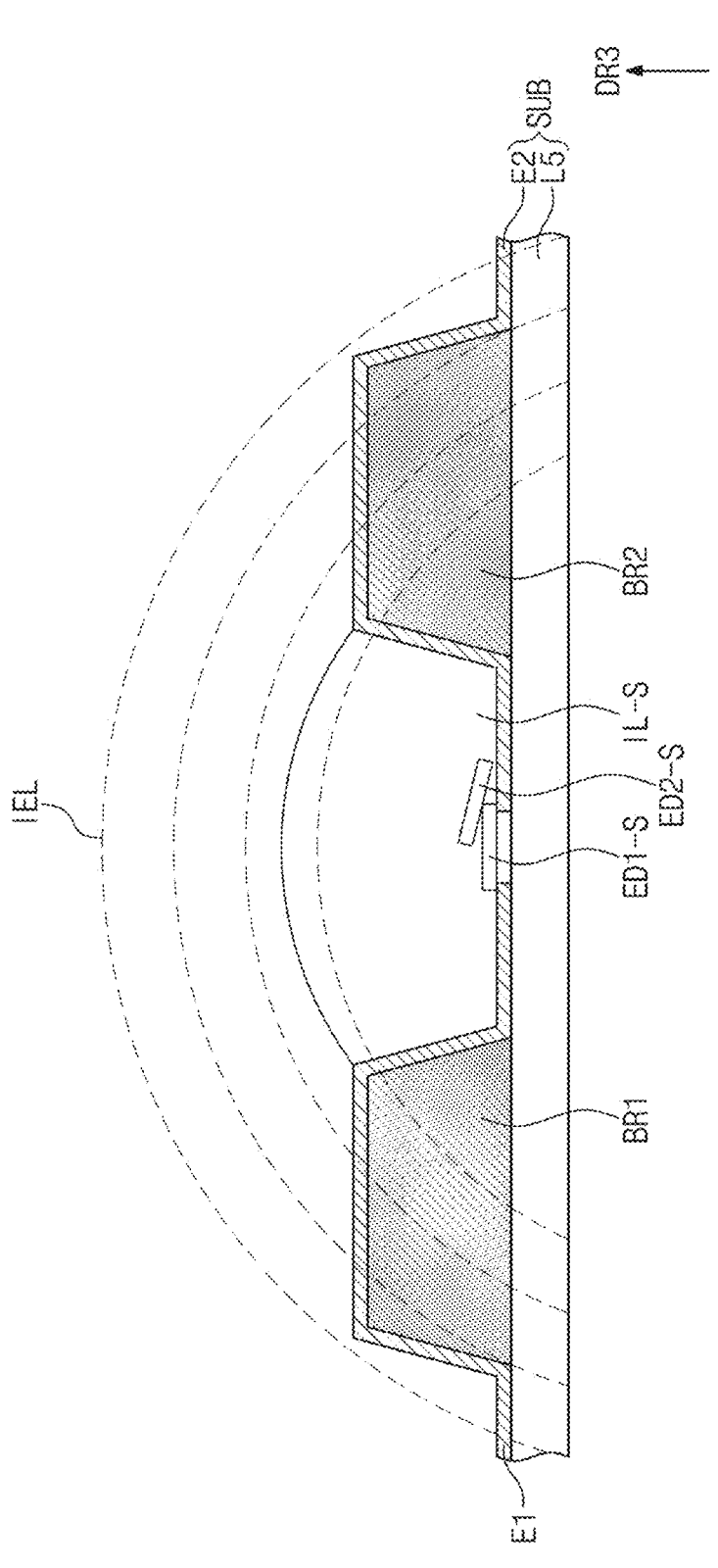
FIG. 10 is a cross-sectional view illustrating a display panel manufacturing method according to Comparative Example.

FIG. 10 is a cross-sectional view illustrating a display panel manufacturing method according to Comparative Example. FIG. 10 illustrates Comparative Example in which only a solution IL-S including light emitting elements ED1-S and ED2-S is applied directly between partition walls BR1 and BR2, unlike an embodiment of the invention in which solutions having different viscosities are applied.

When an electric field IEL is applied to a work substrate, or even when the electric field IEL is applied in a state where the solution IL-S is applied, semiconductor layers of the light emitting elements ED1-S and ED2-S may settle on the work substrate SUB, while being arranged and aligned in a direction toward corresponding electrodes E1 and E2. Thus, a defect in which adjacent light emitting elements ED1-S and ED2-S overlap each other may occur. That is, at least one of the first semiconductor layer SCN and the second semiconductor layer SCP may not be aligned to overlap the corresponding electrode. This defect may be caused by omission of a separate solution layer capable of delaying the sinking time, unlike an embodiment of the invention.

In the display panel manufacturing method using the inkjet printing apparatus 1000 (see FIG. 1) according to an embodiment of the invention, the solutions having different viscosities may be applied in the pre-process and post-process, respectively, thereby increasing the sinking time for arranging and aligning the light emitting elements in the solutions. Accordingly, the display panel manufacturing method with the improved degree of alignment of the light emitting elements may be provided.

Figure 11:
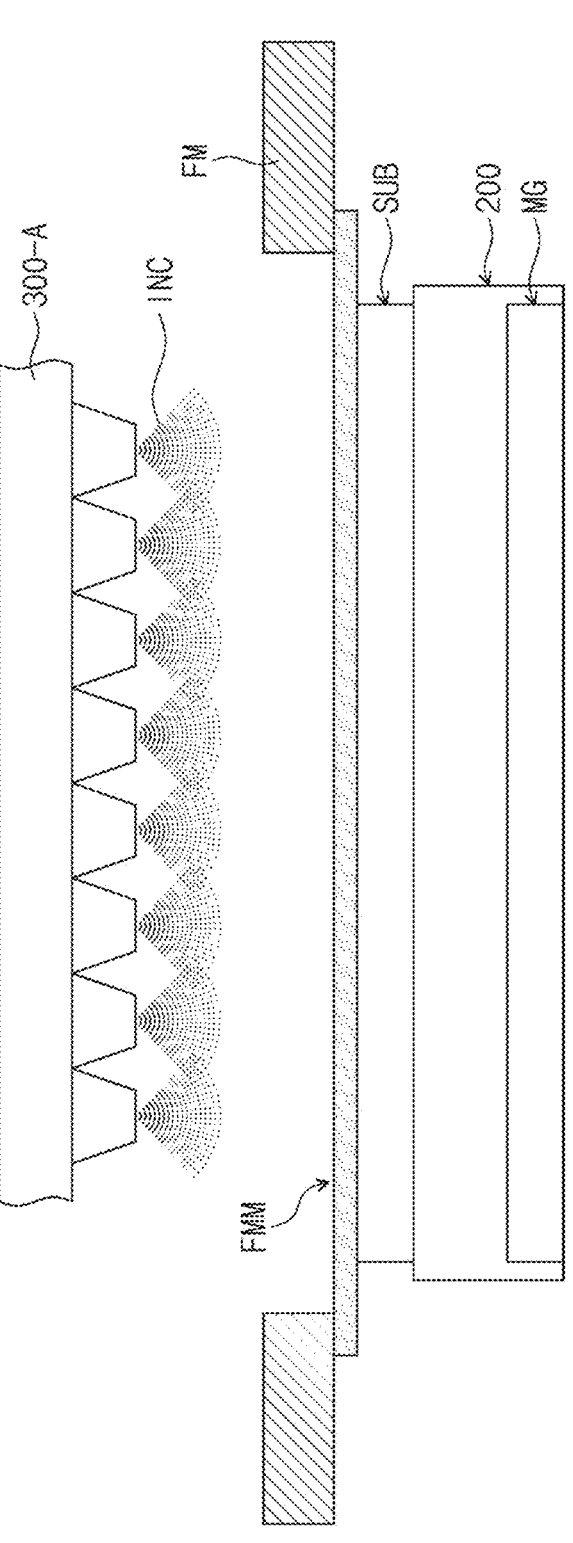
FIG. 11 is a cross-sectional view of an inkjet printing apparatus according to an embodiment of the invention.
Figure 12:
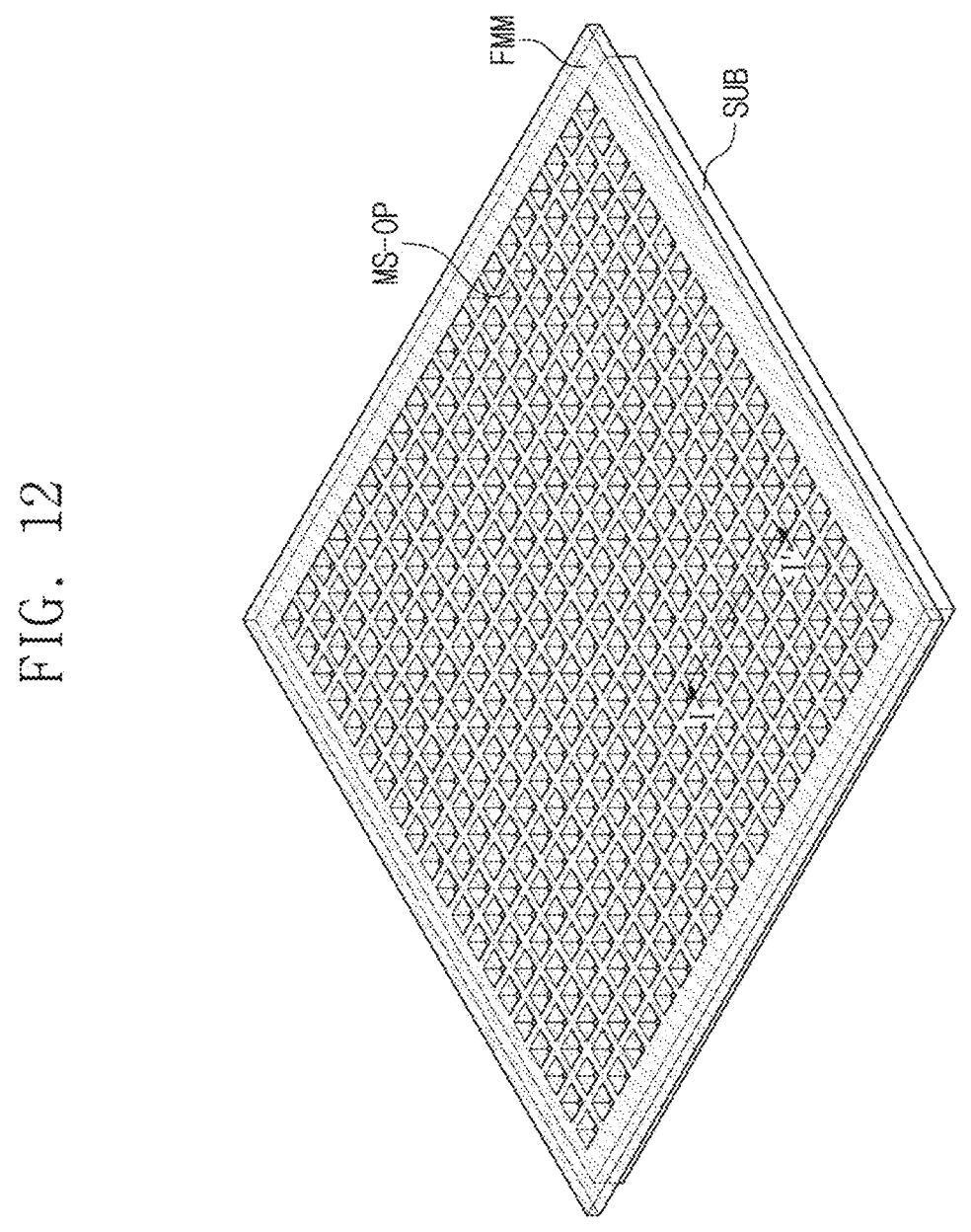
Figure 13:
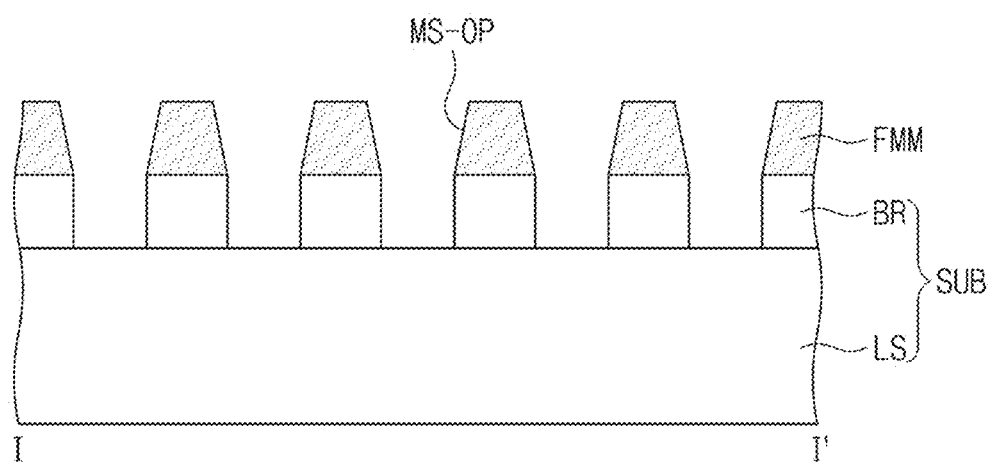
FIG. 13 is a cross-sectional view taken along line I-I' in FIG. 12.

FIG. 11 is a cross-sectional view of an inkjet printing apparatus according to an embodiment of the invention. FIG. 12 is a perspective view illustrating a coupled state of a mask and a work substrate according to an embodiment of the invention. FIG. 13 is a cross-sectional view taken along line I-I' in FIG. 12.

Referring to FIGS. 11 to 13, the inkjet printing apparatus 1000 (see FIG. 1) according to an embodiment may further include a mask FMM disposed on a work substrate SUB, a frame FM that supports the mask FMM, and an electrostatic chuck MG disposed below a stage 200.

A plurality of mask opening portions MS-OP may be defined in the mask FMM. The mask opening portions MS-OP may be formed to pass through the mask FMM. The mask opening portions MS-OP according to an embodiment may overlap inner spaces in the thickness direction surrounded by inner surfaces of partition walls BR in a one-to-one correspondence. Thus, an ink INC sprayed from an inkjet head 300-A may be applied onto the inner spaces defined in the partition walls BR by passing through the mask opening portions MS-OP. The mask FMM according to an embodiment may include an invar.

The electrostatic chuck MG may be disposed inside the stage 200. However, an embodiment of the invention is not limited thereto, and the electrostatic chuck MG may be disposed outside the stage 200. The electrostatic chuck MG may have a magnetic force to stably couple the mask FMM and the work substrate SUB, or the mask FMM and the stage 200. Accordingly, a separation phenomenon may be effectively prevented, which occurs due to a curvature difference between the work substrate SUB and the mask FMM or between the stage 200 and the mask FMM. The electrostatic chuck MG may be provided as any one among a permanent magnet and an electromagnet.

Applying of the ink INC using the mask FMM according to this embodiment may be applied to all of the processes, described in FIGS. 7 and 8, of spraying the ink having different viscosities. The spraying of the ink INC using the mask FMM may be performed through any one process among a spray process, an ultrasonic spray process, a powder spray process, a slot-die coating process, and a screen-printing process.

According to this embodiment, since the mask FMM is disposed on the work substrate SUB, the ink INC sprayed from the inkjet head 300-A may be sprayed onto an entire surface of the work substrate SUB. Although the ink INC is sprayed onto the entire surface of the work substrate SUB, the ink INC may be applied onto the inner spaces of the partition walls BR by passing through the corresponding mask opening portions MS-OP.

In the display panel manufacturing method using the inkjet printing apparatus according to an embodiment of the invention, the solutions having different viscosities may be applied in the pre-process and post-process, respectively, thereby increasing the sinking time for arranging and aligning the light emitting elements in the solutions. Accordingly, the display panel manufacturing method with the improved degree of alignment of the light emitting elements may be provided.

Although the embodiments of the present invention have been described, it is understood that the present invention should not be limited to these embodiments but various changes and modifications can be made by one ordinary skilled in the art within the spirit and scope of the present invention as hereinafter claimed.

Therefore, the technical scope of the invention is not limited to the contents described in the detailed description of the specification, but should be determined by the claims.

What is claimed is:

1. A display panel manufacturing method comprising:
applying a first solution onto a work substrate;
applying, onto the first solution applied onto the work substrate, a second solution comprising a plurality of light emitting elements;
applying an electric field to the work substrate; and
disposing a mask on the work substrate and which defines a mask opening portion that penetrates the mask,
wherein the first solution and the second solution are sprayed toward the mask,

wherein a viscosity of the first solution is different from a viscosity of the second solution.

2. The display panel manufacturing method of claim 1, wherein the viscosity of the first solution is relatively higher than the viscosity of the second solution.

3. The display panel manufacturing method of claim 1, wherein the first solution comprises a first solvent without the light emitting elements, and the second solution comprises a second solvent including the light emitting elements, each of the first solvent and the second solvent including any one among acetone, water, alcohol, toluene, and organic matter.

4. The display panel manufacturing method of claim 1, wherein the applying of the electric field to the work substrate starts after the applying of the first solution and ends after the applying of the second solution.

5. The display panel manufacturing method of claim 1, wherein the applying of the electric field to the work substrate starts after the applying of the second solution.

6. The display panel manufacturing method of claim 1, wherein the work substrate comprises:

a base layer;

a circuit layer disposed on the base layer and including at least one transistor and at least one insulating layer;

a partition wall disposed on the circuit layer and defining an inner space; and a first electrode and a second electrode at least partially disposed in the inner space and spaced apart from each other, the first solution and the second solution being applied onto the inner space.

7. The display panel manufacturing method of claim 6, wherein each of the plurality of light emitting elements is a bipolar element which comprises a first semiconductor layer, a second semiconductor layer, an active layer disposed between the first semiconductor layer and the second semiconductor layer, and an insulating layer surrounding the first semiconductor layer, the second semiconductor layer, and the active layer.

8. The display panel manufacturing method of claim 7, wherein in the applying of the electric field to the work substrate, the plurality of light emitting elements are aligned so that the first semiconductor layer overlaps the first electrode and the second semiconductor layer overlaps the second electrode in a thickness direction.

9. The display panel manufacturing method of claim 6, wherein the mask opening portion corresponds to the inner space.

10. The display panel manufacturing method of claim 9, further comprising applying a magnetic force to the work substrate and the mask.

11. The display panel manufacturing method of claim 6, wherein the first electrode and the second electrode are each provided in plurality, and the plurality of first electrodes and the plurality of second electrodes are arranged alternately.

12. The display panel manufacturing method of claim 1, wherein the first solution is provided through any one process among an inkjet printing process, a spray process, a slot-die coating process, and a screen-printing process.

13. The display panel manufacturing method of claim 1, wherein the second solution is provided through any one process among an inkjet printing process, a spray process, an ultrasonic spray process, a powder spray process, a slot-die coating process, and a screen-printing process.

14. The display panel manufacturing method of claim 1, wherein the first solution and the second solution are printed from different inkjet heads.

15. An inkjet printing apparatus comprising:

a stage on which a work substrate is disposed;

a probe device configured to provide an electric field to the work substrate;

a first head configured to print a first solution onto the work substrate;

a second head configured to print a second solution onto the first solution; and a mask which is disposed on the work substrate and in which a plurality of mask opening portions are defined, wherein the second solution includes a plurality of light emitting elements, wherein a viscosity of the first solution is different from a viscosity of the second solution.

16. The inkjet printing apparatus of claim 15, wherein the viscosity of the first solution is relatively higher than the viscosity of the second solution.

17. The inkjet printing apparatus of claim 15, wherein the probe device applies the electric field on the work substrate after the first solution is printed, until after the second solution is printed.

18. The inkjet printing apparatus of claim 15, wherein the probe device applies the electric field on the work substrate after the second solution is printed.

19. The inkjet printing apparatus of claim 15, wherein the first solution and the second solution pass through the mask opening portions to be applied onto the work substrate.

20. The inkjet printing apparatus of claim 19, further comprising an electrostatic chuck disposed below the stage and configured to form a magnetic force to couple the work substrate and the mask.

* * * * *